(12) United States Patent
Liu et al.

(10) Patent No.: US 7,755,161 B2
(45) Date of Patent: Jul. 13, 2010

(54) SEMICONDUCTOR DEVICES

(75) Inventors: Xuefeng Liu, South Burlington, VT (US); Robert M. Rassel, Colchester, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/237,148

(22) Filed: Sep. 24, 2008

(65) Prior Publication Data

US 2009/0039385 A1 Feb. 12, 2009

Related U.S. Application Data

(62) Division of application No. 11/422,690, filed on Jun. 7, 2006, now Pat. No. 7,538,409.

(51) Int. Cl.
*H01L 29/00* (2006.01)

(52) U.S. Cl. .................. 257/511; 257/510; 257/506; 257/E21.371

(58) Field of Classification Search ......... 257/506–511, 257/520, 587–588, E21.371; 438/296, 425, 438/430–432
See application file for complete search history.

(56) References Cited

U.S. PATENT DOCUMENTS

| | | | |
|---|---|---|---|
| 4,005,469 A | 1/1977 | Chang et al. | |
| 4,484,244 A | 11/1984 | Avery | |
| 4,562,454 A | 12/1985 | Schultz et al. | |
| 4,644,383 A | 2/1987 | Akcasu | |
| 5,422,501 A | 6/1995 | Bayraktaroglu | |
| 6,066,179 A | 5/2000 | Allan | |
| 6,163,446 A | 12/2000 | Norstrom et al. | |
| 6,301,689 B1 | 10/2001 | Darden | |
| 6,455,902 B1 | 9/2002 | Voldman | |
| 6,505,325 B1 | 1/2003 | Hamamoto | |
| 6,600,199 B2 | 7/2003 | Voldman et al. | |

(Continued)

FOREIGN PATENT DOCUMENTS

JP 63261752 A2 10/1988

OTHER PUBLICATIONS

Notice of Allowance in U.S. Appl. No. 11/870,567, dated Apr. 21, 2009.

(Continued)

*Primary Examiner*—Dung A Le
(74) *Attorney, Agent, or Firm*—Anthony J. Canale; Roberts Mlotkowski Safran & Cole, P.C.

(57) ABSTRACT

A device comprises a first sub-collector formed in an upper portion of a substrate and a lower portion of a first epitaxial layer and a second sub-collector formed in an upper portion of the first epitaxial layer and a lower portion of a second epitaxial layer. The device further comprises a reach-through structure connecting the first and second sub-collectors and an N-well formed in a portion of the second epitaxial layer and in contact with the second sub-collector and the reach-through structure. The device further comprises N+ diffusion regions in contact with the N-well, a P+ diffusion region in contact with the N-well, and shallow trench isolation structures between the N+ and P+ diffusion regions.

8 Claims, 11 Drawing Sheets

U.S. PATENT DOCUMENTS

| | | |
|---|---|---|
| 6,770,918 B2 | 8/2004 | Russ et al. |
| 6,803,259 B2 | 10/2004 | Lee |
| 6,870,202 B2 | 3/2005 | Oka |
| 6,901,566 B2 | 5/2005 | Mizumasa |
| 6,919,603 B2 | 7/2005 | Brodsky et al. |
| 7,297,604 B2 | 11/2007 | Shin et al. |
| 2001/0042236 A1 | 11/2001 | Darden |
| 2001/0042867 A1 | 11/2001 | Furuhata |
| 2002/0084506 A1 | 7/2002 | Voldman et al. |
| 2003/0094673 A1 | 5/2003 | Dunn et al. |
| 2004/0199886 A1 | 10/2004 | Liang et al. |
| 2004/0227210 A1 | 11/2004 | Tilke et al. |
| 2007/0004160 A1 | 1/2007 | Voldman |
| 2007/0241421 A1 | 10/2007 | Liu et al. |

OTHER PUBLICATIONS

Notice of Allowance for U.S. Appl. No. 11/422,690, dated Aug. 18, 2008.

Office Action in U.S. Appl. No. 11/870,567, dated Nov. 4, 2008.

SEMICONDUCTOR DEVICES

CROSS REFERENCE TO RELATED APPLICATIONS

The present application is a divisional application of U.S. application Ser. No. 11/422,690, filed on Jun. 7, 2006 now U.S. Pat. No. 7,538,409, the contents of which are incorporated by reference in its entirety herein.

FIELD OF THE INVENTION

The invention relates generally to semiconductor devices, and more specifically, devices with noise isolation and ESD protection components.

BACKGROUND OF THE INVENTION

Electrostatic discharge (ESD), a surge in current (negative or positive) that occurs when a large amount of current is applied to an integrated circuit, may cause substantial damage to, or even destruction of, the circuit. ESD events are particularly troublesome for BiCMOS RF (radio frequency) chips because of their low power requirements and extreme sensitivity. Therefore, on-chip ESD protection circuits for BiCMOS chips are essential.

Historically, there have been several approaches to noise isolation and ESD protection. These include: STI-bound P+/N-well diode structures (also known as STI-bound diodes); polysilicon MOSFET (metal oxide semiconductor field effect transistor) gate defined PN diode structures (also known as polysilicon bound diodes); N+ in P– substrate diodes, whether with a poly border or shallow trench isolation to define the edge (also known as N-well to substrate diodes). Such approaches may result in (1) creating a forward-biased PNP structure and injecting current into the substrate, which generates noise; (2) forming a vertical PNP structure with a common collector, which may have high leakage, may cause Darlington amplification effects, or may be temperature- or photo-sensitive; or (3) non-ideal turn-on voltage.

Accordingly, a need has developed in the art for structures that will provide noise isolation and ESD protection in RF or similar applications.

SUMMARY OF THE INVENTION

In a first aspect of the invention, a device comprises a first sub-collector formed in an upper portion of a substrate and a lower portion of a first epitaxial layer and a second sub-collector formed in an upper portion of the first epitaxial layer and a lower portion of a second epitaxial layer. The device further comprises a reach-through structure connecting the first and second sub-collectors and an N-well formed in a portion of the second epitaxial layer and in contact with the second sub-collector and the reach-through structure. The device further comprises N+ diffusion regions in contact with the N-well, a P+ diffusion region contained within the N-well, and shallow trench isolation structures between the N+ and P+ diffusion regions.

In a second aspect of the invention, a device comprises a P– doped region located within a first epitaxial layer which is isolated by a deep trench isolation structure and a sub-collector formed in an upper portion of a substrate and a lower portion of the first epitaxial layer. The device further comprises a reach-through structure connecting the sub-collector and a first N+ diffusion region, and a second N+ diffusion region diffused in the second epitaxial layer. The device further comprises a P+ diffusion region diffused in the second epitaxial layer and isolated from the N+ diffusion regions.

In another aspect of the invention, a device comprises a P– doped region located within a first epitaxial layer. The device further comprises a sub-collector formed in an upper portion of a substrate and a lower portion of a first epitaxial layer and a reach-through structure connecting the sub-collector and a first N+ diffusion region. The device further comprises an N+ diffusion region connecting with the second epitaxial layer, and a P+ diffusion region in contact with the second epitaxial layer.

DETAILED DESCRIPTION OF EMBODIMENTS OF THE INVENTION

Figure 1:
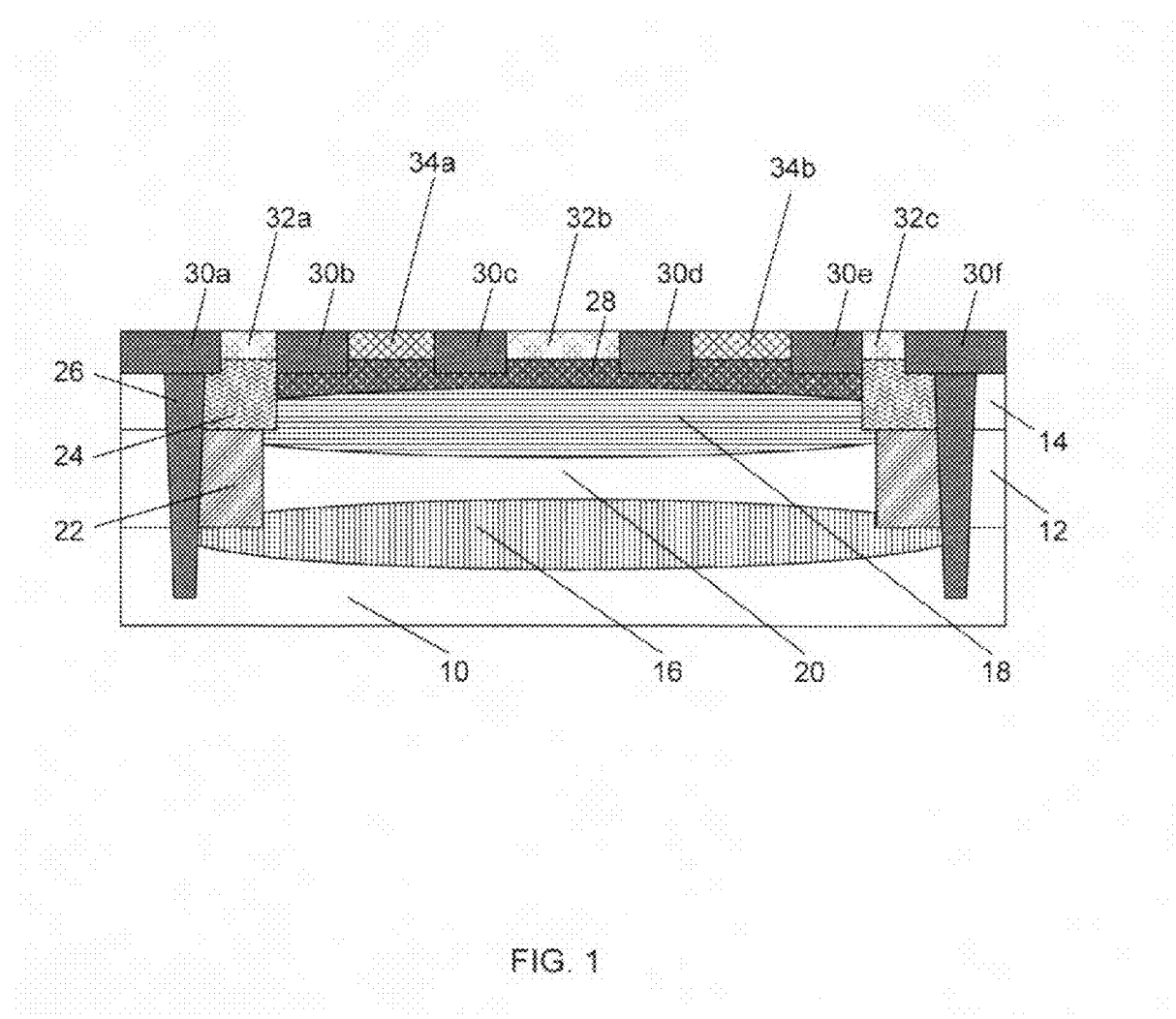
FIGS. 1-11 show alternative structures in accordance with the invention.

The invention relates to a semiconductor device. In embodiments, the invention more specifically relates devices with noise isolation and ESD protection components. In embodiments, a stacked reach-through structure and deep sub-collector form a cathode or collector. Alternatively, in embodiments, dual epitaxial layers form a double-epitaxy triple-well ESD network. In either instance, a P-type device (e.g. a PFET) or an N-type device (e.g. an NFET) may be isolated from the substrate. The invention may be suitable for millimeter wave (mmW) technology for RF CMOS, BiCMOS, RF BiCMOS, RF BiCMOS Silicon Germanium (SiGe), and RF BiCMOS Silicon Germanium Carbon (SiGeC) devices, to name a few. (U.S. Pat. No. 7,329,940 is herein incorporated by reference in its entirety.)

In the discussion that follows, like reference numerals are used to refer to similar elements, such that a detailed discussion of each like element is not repeated for each embodiment. Further, as will be understood by one of skill in the art, in alternative embodiments, although shown in the figures in only two dimensions, elements of the present invention may be configured in three-dimensional rings around a vertical center line drawn through each figure. That is, in alternative embodiments, all elements, some elements, or no elements may be configured in three-dimensional rings.

Referring to FIG. 1, a double-epitaxy, double sub-collector ESD device according to one embodiment of the invention is shown. The device may be formed by any conventional methods. The structure shown in FIG. 1 comprises a substrate 10, a first epitaxial (epi) layer 12, and a second epi layer 14. The first epi layer 12 is located between the substrate 10 and the second epi 14. In one embodiment, the substrate 10 may be Silicon or Germanium, but other materials and/or substrates may equally be used, such as for example, SOI. The thickness of the first epi layer 12 may range from approximately 0.25 to 5 μm, which effectively increases the distance of a sub-collector from a surface of the device. The thickness of the second epi layer 14 is, in embodiments of the invention, approximately in the range of 0.25 to 5 μm, which may be in the same range as the thickness of the first epi layer 12.

The structure further comprises a first sub-collector 16, also referred to as a "deep sub-collector" (DS), which is an N+ region formed in an upper portion of the substrate 10 and a lower portion of the first epi layer 12. A deep sub-collector 16 is, for example, a collector that is located relatively further away from the top surface of the structure. In embodiments, the deep sub-collector 16 may have been formed through a conventional ion implantation process, using dopants such as, for example, Arsenic (As), Antimony (Sb), Phosphorous (P), or other N-doped elements. In embodiments, the doping concentration of the deep sub-collector 16 is relatively high, for example from $1 \times 10^{18}/cm^3$ to $1 \times 10^{21}/cm^3$. In embodiments, the sheet resistance of the deep sub-collector 16 may range from approximately 1 to 100 ohms/square.

The structure further comprises a second sub-collector 18, also referred to as a "near sub-collector" (NS), which is formed in an upper portion of the first epi layer 12 and lower portion of the second epi layer 14. A near sub-collector 18 is, for example, a collector that is located relatively closer to the top surface of the structure than the deep sub-collector 16. In embodiments, the near sub-collector 18 may have been formed through a conventional ion implantation process, using dopants such as, for example, Arsenic (As), Antimony (Sb), Phosphorous (P), or other N-doped elements. In embodiments, the doping concentration of the near sub-collector 18 is relatively high, for example, from $1 \times 10^{18}/cm^3$ to $1 \times 10^{21}/cm^3$. In embodiments, the sheet resistance of the near sub-collector 18 may range from approximately 1 to 100 ohms/square.

The structure further comprises a doped region 20, which is formed in a portion of the first epi layer 12 above the deep sub-collector 16 and below the near sub-collector 18. The doped region 20 may be either a P− region or an N− region. If the doped region 20 is a P− region, this may be the natural epi doping, or may be implanted, for example, with Boron (B). If the doped region 20 is an N—region, this may be the natural epi doping, or may be implanted, for example, with Arsenic (As), Antimony (Sb), or Phosphorous (P). If the doped region 20 is an N− region, it is not as isolated from the substrate 10 as the case where it is a P− region, but such an N—region provides a lower resistance cathode than a P− region.

The structure further comprises a deep reach-through 22, which is in contact with the lateral edges of the deep sub-collector 16 and the near sub-collector 18, and electrically and thermally connects the two sub-collectors. In embodiments, the deep reach-through 22 may have been formed through a conventional ion implantation process, using dopants such as, for example, Arsenic (As), Antimony (Sb), Phosphorous (P), or other N-doped elements. Although there is, in embodiments, a separation between the deep sub-collector 16 and the near sub-collector 18, the deep reach-through 22 provides a low-resistance connection.

The structure further comprises a near reach-through 24, which is in contact with the lateral edge of the near sub-collector 18, and stacked upon the deep reach-through 22. In embodiments, the near reach-through may have been formed in any conventional manner, as described with reference to the deep reach-through 22.

Optionally, the structure may further comprise a deep trench isolation (DTI) structure 26 in contact with the lateral edge of the stacked reach-throughs 22 and 24. It should be understood that the DTI 26 may include dielectric sidewall material and a fill material in the dielectric, e.g. polysilicon, BPSG, or PSG. Alternatively, the DTI 26 may comprise local oxidation of Silicon ("LOCOS") or recessed oxide structures ("ROX") structures. The DTI 26 is integrated with both the deep and near reach-through structures 22 and 24. In the case where the DTI 26 is not included in the structure, it will be understood that the deep and near reach-throughs 22 and 24 function as a perimeter around the first and second epi layers.

The structure further comprises an N-well implant 28 formed in the second epi layer 14. Effectively, the near reach-through 24 acts as a border of the N-well region 28 to eliminate the lateral bipolar gain. As shown in FIG. 1, the structure further comprises shallow trench isolation (STI) structures 30a-30f, N+ diffusion regions 32a-32c, and P+ diffusion regions 34a and 34b. It will be understood by one of skill in the art that the N+ diffusion regions 32a and 32c form the cathode, and the P+ diffusion regions 34a and 34b form the anode, of an STI-bound P+/N-well diode.

Figure 2:
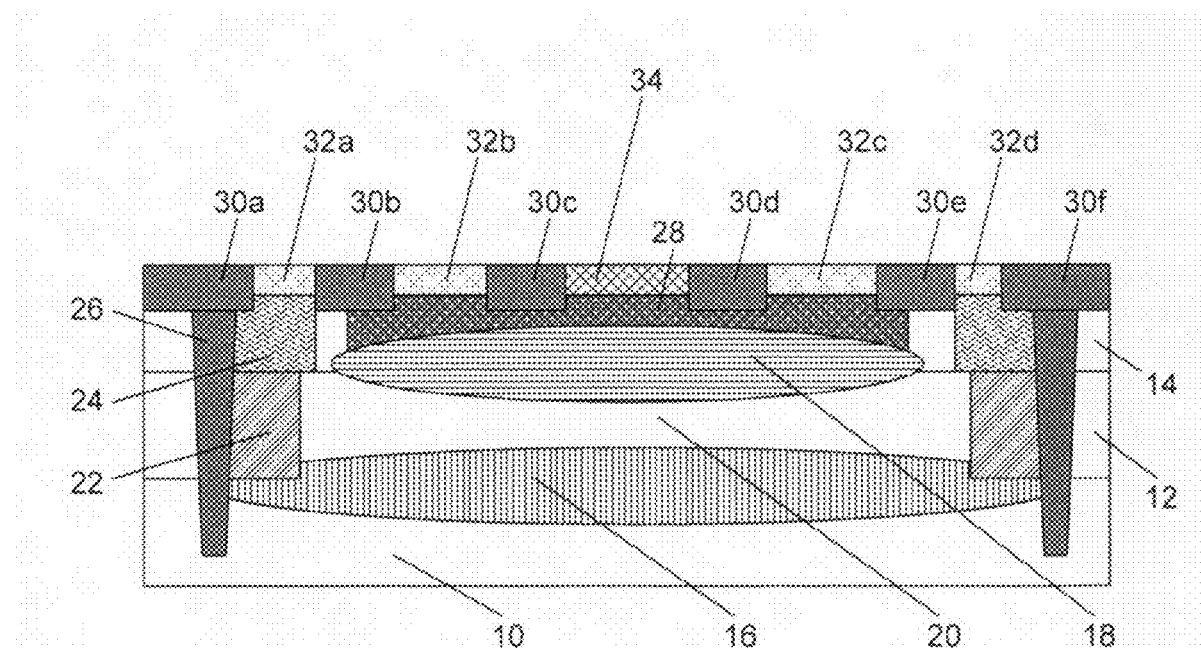

FIG. 2 shows a triple-well double-epi ESD device according to an alternative embodiment of the invention. The alternative embodiment of FIG. 2 differs from that of FIG. 1 in various ways. First, in FIG. 2 the near sub-collector 18 and N-well 28 are not adjacent to or in contact with the deep and near reach-throughs 22 and 24. Second, in FIG. 2, the diffusions on the surface of the device are rearranged such that in FIG. 2, the P+ diffusion 34 is in the center of the device, and is surrounded by N+ diffusions 32a-32d. Therefore, this embodiment forms a P+/N+ diode in an isolated P-region.

In the alternative embodiment of FIG. 2, the N+ diffusions 32b and 32c serve as the collector, while the N+ diffusions 32a and 32d serve as the electrical contact to the near reach-through 24, and the near sub-collector 18 serves as a low-resistance cathode and reduces injection into the isolated epi region 20. The deep and near reach-throughs 22 and 24 isolate the isolated epi region 20 such that the near sub-collector 18 and the isolated epi region 20 are more isolated than in the embodiment shown in FIG. 1, and can be independently biased. Thus, it is possible to change the capacitance between the near sub-collector 18 and the isolated epi region 20, independent of the substrate 10. Additionally, injection from the substrate 10 back into the P+/N+ diode is likewise prevented. In this way, a string of such devices will not communicate with each other, but rather, each diode will work independently.

In the alternative embodiment of FIG. 2, the DTI 26 is optional, but if it is not employed, then the deep and near reach-throughs 22 and 24 should be three-dimensional rings. If the DTI 26 is employed and is a three-dimensional ring, then the deep and near reach-throughs 22 and 24 may or may not be three-dimensional rings, and in fact, may or may not be present.

This double-epi structure is advantageous over triple-well CMOS in that in triple-well CMOS technology, the PFET or NFET are both not truly isolated from the chip substrate. Rather, the PFET or NFET is located in an N-well or P-well (respectively), and the N-well or P-well is abutting the substrate, which does not completely isolate the PFET or NFET. In contrast, as will be understood from the above discussion, the embodiment of FIG. 2 will completely isolate a P-type device (e.g. a PFET) or an N-type device (e.g. an NFET) from the substrate.

Figure 3:
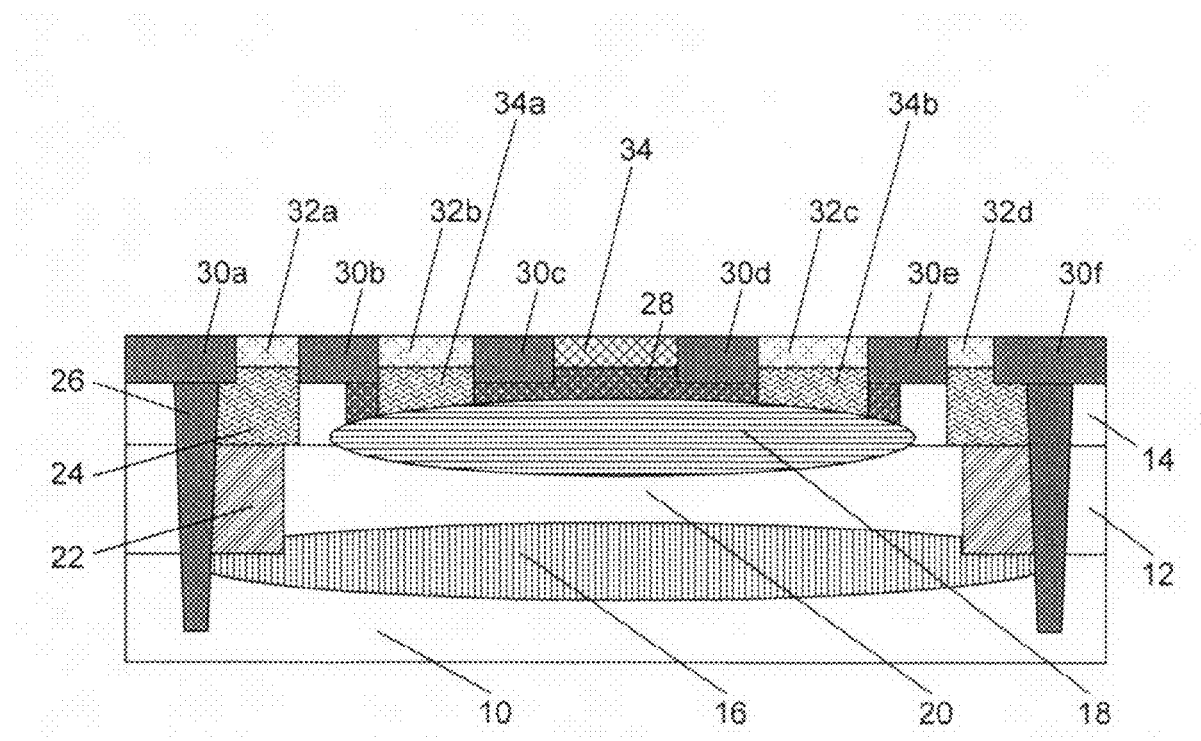

FIG. 3 shows an alternative triple-well double-epi ESD device according to an alternative embodiment of the invention. The alternative embodiment of FIG. 3 differs substantially from that of FIG. 2 in that a second near reach-through structure(s) 34a and 34b electrically connect the near sub-collector 18 and the N+ diffusion(s) 32b and 32c. In this manner, the series resistance of the cathode is lowered. It should be understood that the diffusions on the surface of the device may alternatively be rearranged such that an N+ diffusion is in the center, with the second near reach-through 34 adjacent to it, and electrically connecting it to the near sub-collector 18.

Figure 4:
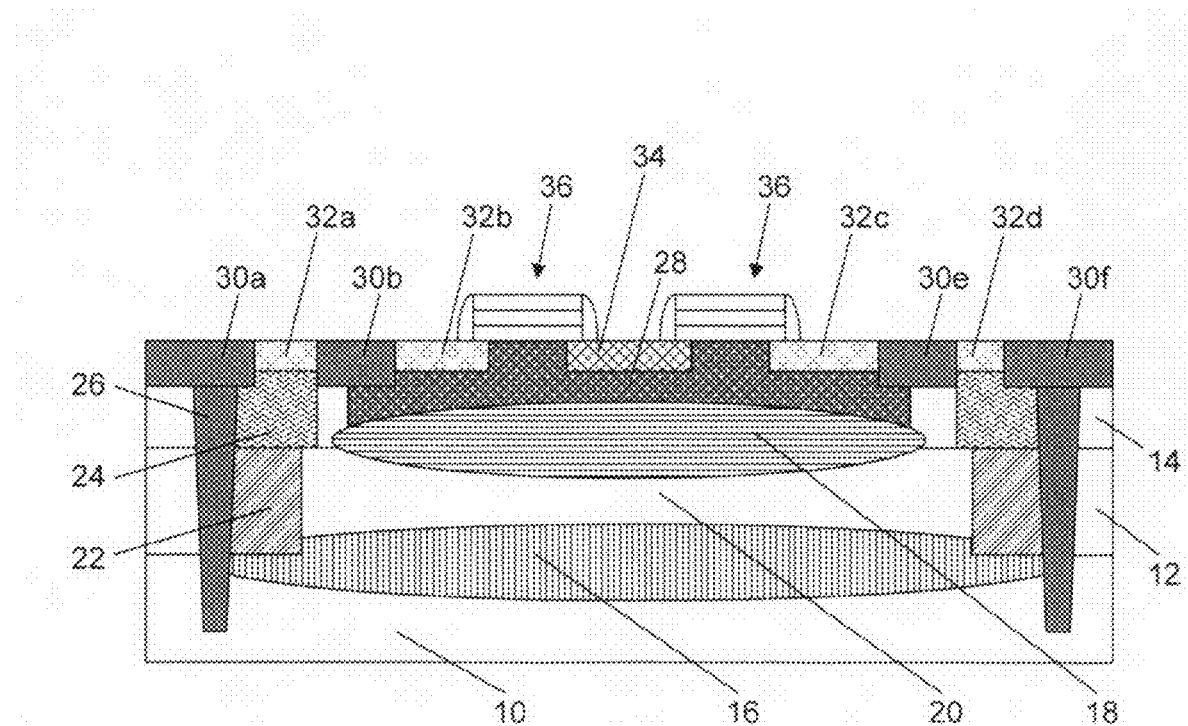

FIG. 4 shows an alternative double-epi double sub-collector polysilicon bound diode ESD device. The alternative embodiment of FIG. 4 differs from that of FIG. 3 in that while FIG. 3 employed an STI-bound diode, the embodiment shown in FIG. 4 employs a polysilicon bound diode. That is, instead of the central P+ diffusion 34 being surrounded by STIs 30c and 30d as shown in FIG. 3, in FIG. 4 the central P+ diffusion 34 is surrounded by a polysilicon MOSFET gate structure 36. As will be understood by one of skill in the art, the polysilicon MOSFET gate structure 36 comprises a thin film dielectric (e.g., an oxide layer), a polysilicon film, and spacer(s) on the sidewall(s). Effectively, the polysilicon MOSFET gate structure serves as a block mask (e.g., dummy structure) to break the silicide between the P+ and N+ regions; that is, insulation which forms the spacers is used to prevent shorts.

Figure 5:
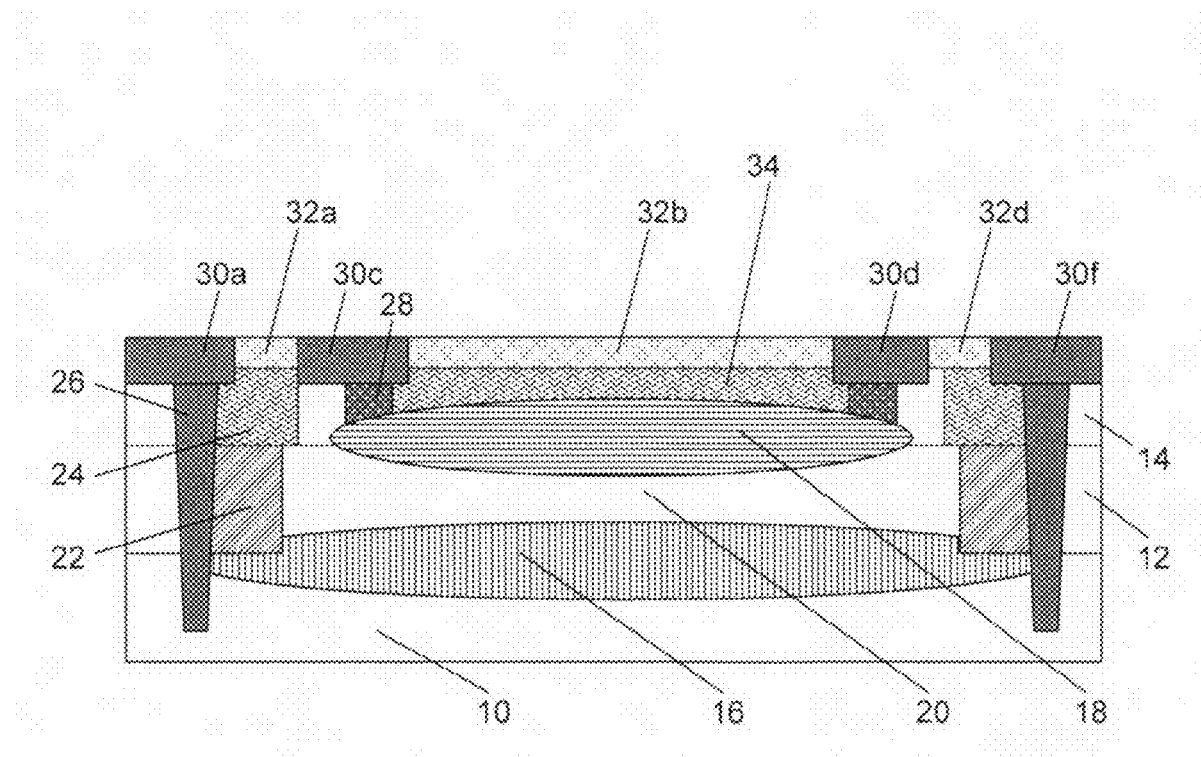

FIG. 5 shows an alternative double-epi double sub-collector ESD device with an N+ diffusion 32$b$ as the contact to the N-well 28, connected by an optional near reach-through 34. Whereas previous embodiments employed an N-well to substrate diode, the embodiment of FIG. 5 shows an N+ diffusion diode, which can discharge into the doped region 20 in the first epi layer 12. It will be understood by one of skill in the art that it is not necessary that the N+ diffusion 32$b$ be as wide as is shown in FIG. 5, but rather could optionally be surrounded by a P+ diffusion. Additionally, as another alternative, the electrodes may be switched as discussed above with reference to FIG. 3. In any case, in the embodiment shown in FIG. 5, when the deep sub-collector 16, and the deep and near reach-throughs 22 and 24 are tied to V.sub.dd, a vertical NPN transistor is formed for discharge between negative pulses and V.sub.dd, that is, for negative polarity pulse events. Thus a vertical bipolar NPN transistor is formed between the deep and near sub-collectors 16 and 18.

Figure 6:
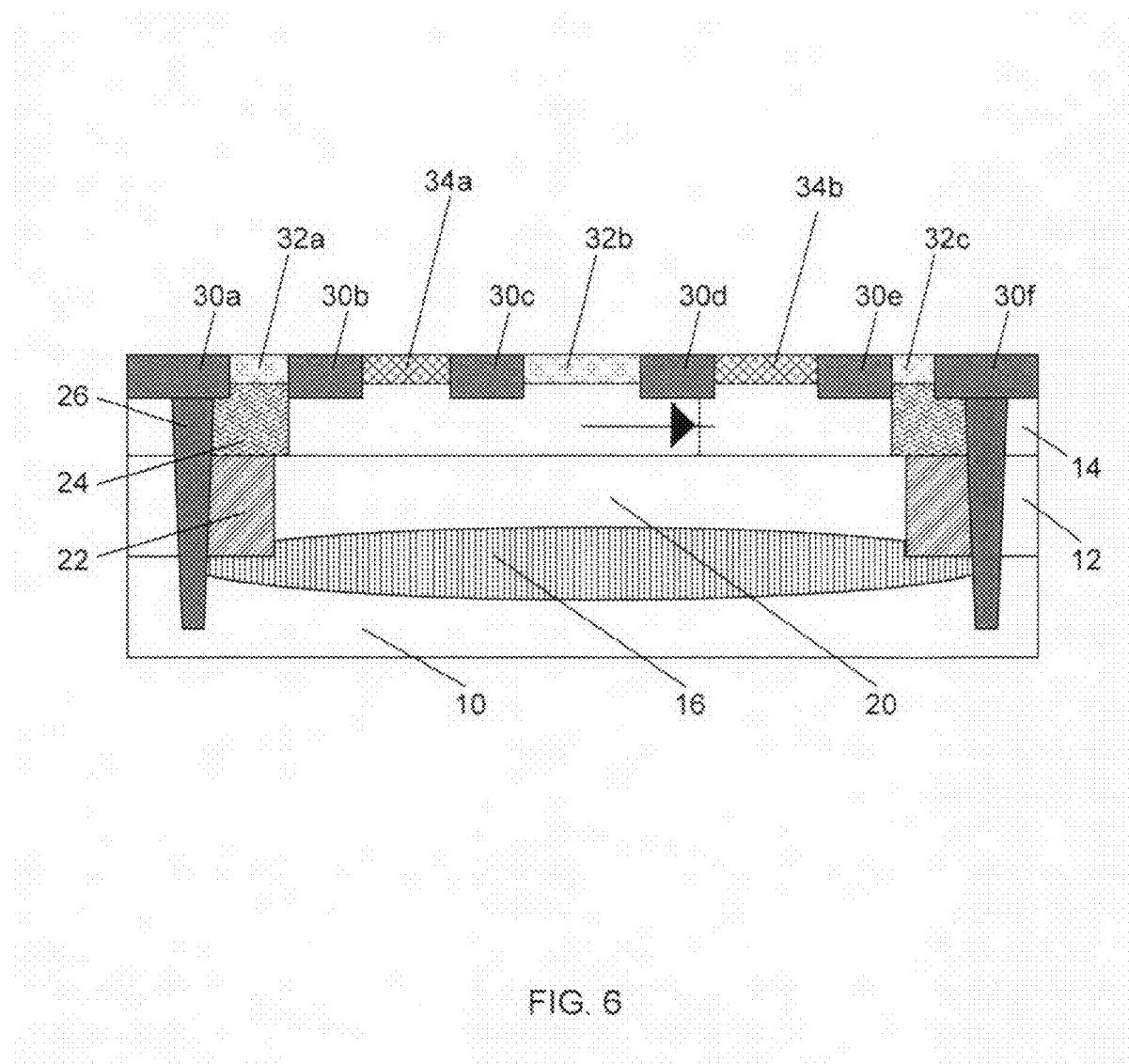

FIG. 6 shows an alternative double-epitaxy ESD device. In this embodiment, an N+ diffusion diode is located in an isolated epi region 20. In this embodiment, the reach-through structure 22 and 24 and the deep sub-collector 16 form the cathode of an STI-bound diode or a PN diode.

Figure 7:
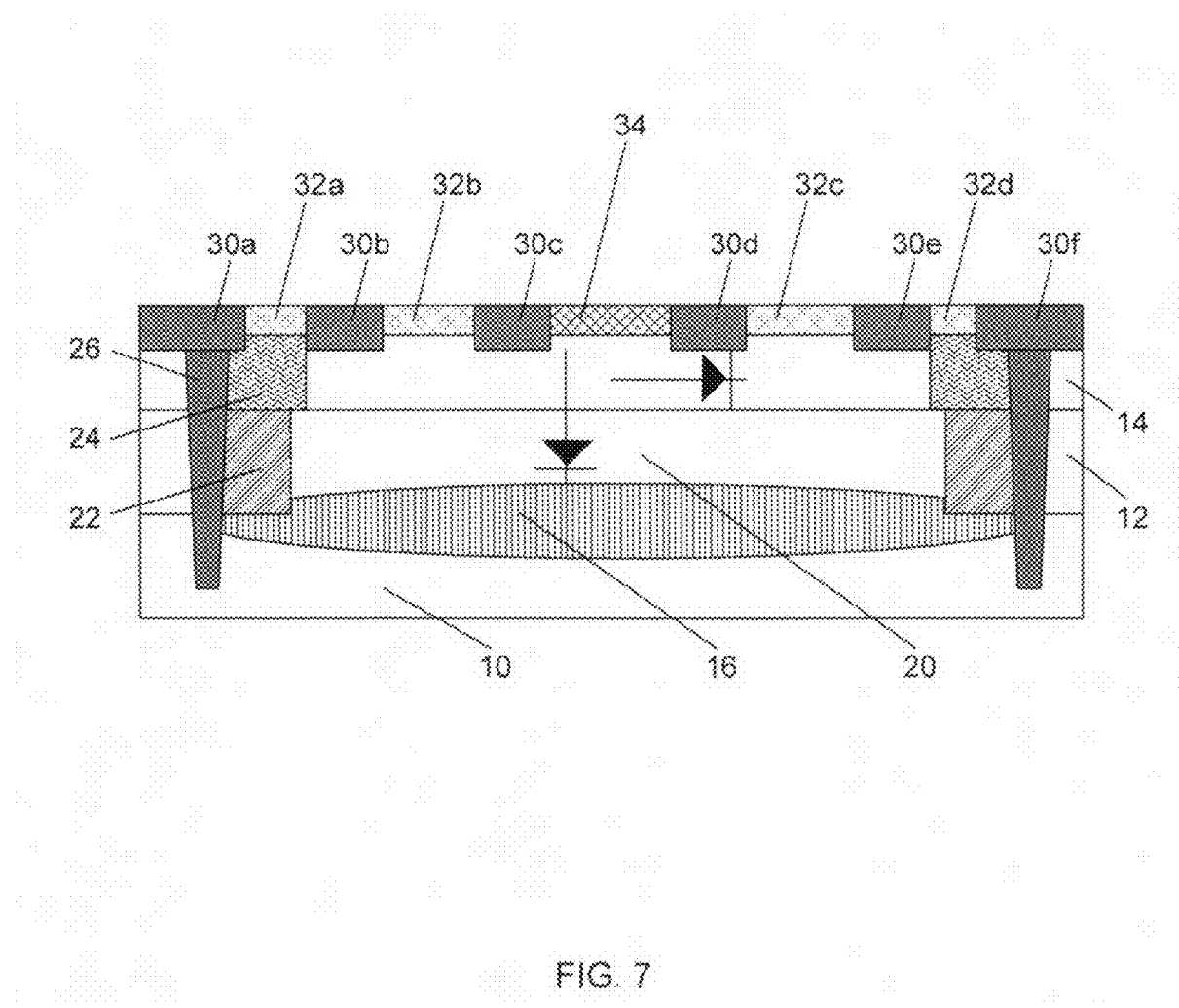

FIG. 7 shows an alternative double-epi triple-well diode ESD device. In this embodiment, a P+/P− diode is formed, and the N+ diffusion 32$b$ and the deep sub-collector 16 form cathodes of two diodes in parallel.

Figure 8:
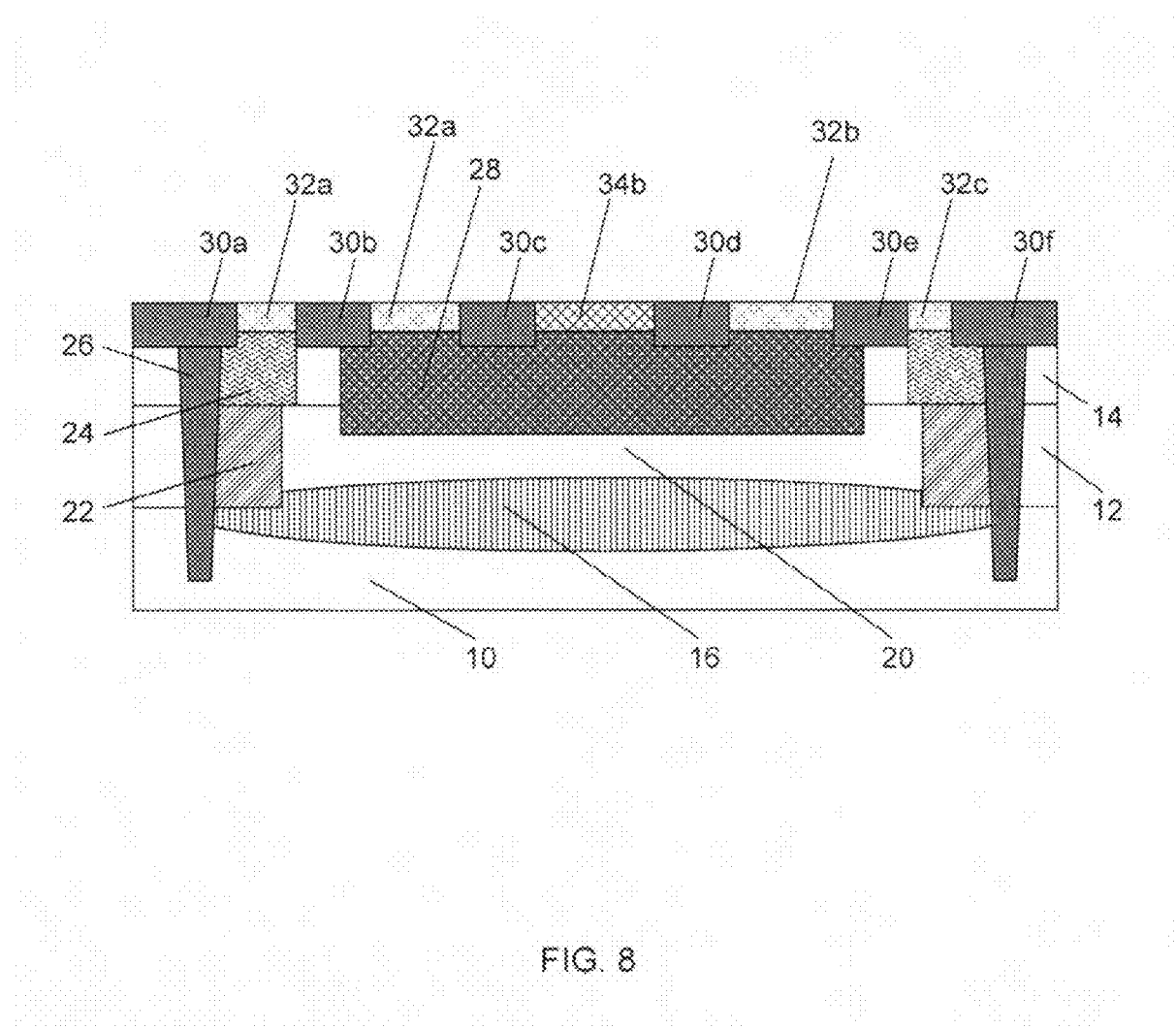

FIG. 8 shows an alternative vertical SCR double-epi ESD device. In this embodiment, the P+ diffusion 34$b$ is located in an N-well 28. Additionally, an SCR is formed by the PNPN structure produced by the P+ diffusion 34$b$, the N-well 28, the P− doped region 20, and the N+ deep sub-collector 16. The P+ diffusion 34$b$ serves as the anode, and the deep sub-collector 16 serves as the cathode. It should be understood by one of skill in the art that the N-well 28 may or may not extend into the first epi layer 12.

In the embodiments shown in FIGS. 2-5 and 8, the doped region 20 is effectively isolated as though in a Faraday cage. That is, the doped region 20 is isolated vertically by the deep sub-collector 16, laterally by the reach-through structures 22 and 24, and optionally by the DTI 26. In the Faraday cage, the deep sub-collector 16, and the reach-through structures 22 and 24 are not merged, in embodiments. The doped region 20 is sometimes referred to as an "isolated epi" region.

Additionally, in these embodiments, the deep sub-collector 16 and the near sub-collector 18 are coupled together such that the vertical injection from the P+ diffusion regions 34$a$ and 34$b$ into the substrate 10 is eliminated. Rather, because the near sub-collector 18 is physically separated from the deep sub-collector 16, the injection is to the doped region 20 of the first epi layer 12, which is grounded. Furthermore, the DTI 26 eliminates the lateral injection into any adjacent structure.

As will be understood by one of skill in the art, the lower the sheet resistance of the N-well 28, the better the ESD protection. For this reason, the parallel resistance of the deep and near sub-collectors 16 and 18 provide a low-resistance cathode which effectively improves the ESD protection.

It will be understood by one of skill in the art that the doped region 20 in the first epi layer 12 and the deep sub-collector 16 together may form an element of the device. In the case of a bipolar transistor, these two regions form the base and collector. In the case of a PNPN structure, these two regions form the latter two PN elements, as in the cathode of a silicon controlled rectifier (SCR). In the case of an NPN structure, these two regions form the PN elements.

Figure 9:
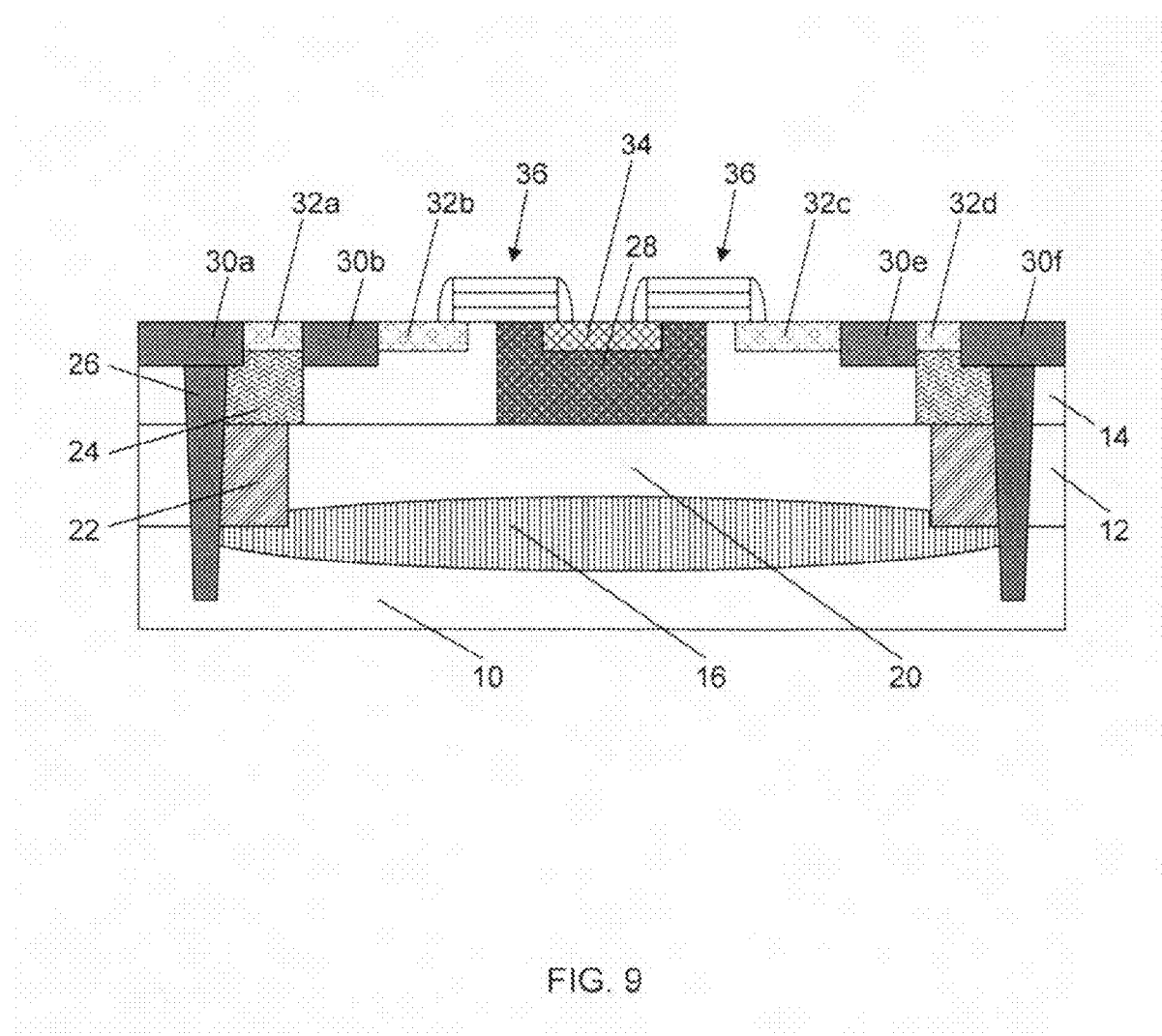

FIG. 9 shows an alternative lateral-vertical SCR double-epi ESD device. In this embodiment, the diode is polysilicon bound rather than STI-bound, as discussed above in reference to FIG. 4. The diode may be either an N-diffusion or an N-well diode. This embodiment differs, though, in that the N-well 28 is sufficiently narrow such that the polysilicon gate structure 36 extends beyond the area between the N-well 28 and the P-region of the second epi layer 14, such that a very high-current, low-voltage turn-on circuit is produced. It will be understood that PNPN regions are formed both vertically and laterally. The P+ diffusion region 34 forms an anode and the 16 sub-collector forms a cathode of a vertical SCR; while the P+ diffusion region 34 forms an anode and the N+ diffusion region(s) 32$b$ and 32$c$ form(s) the cathode of a lateral SCR.

Figure 10:
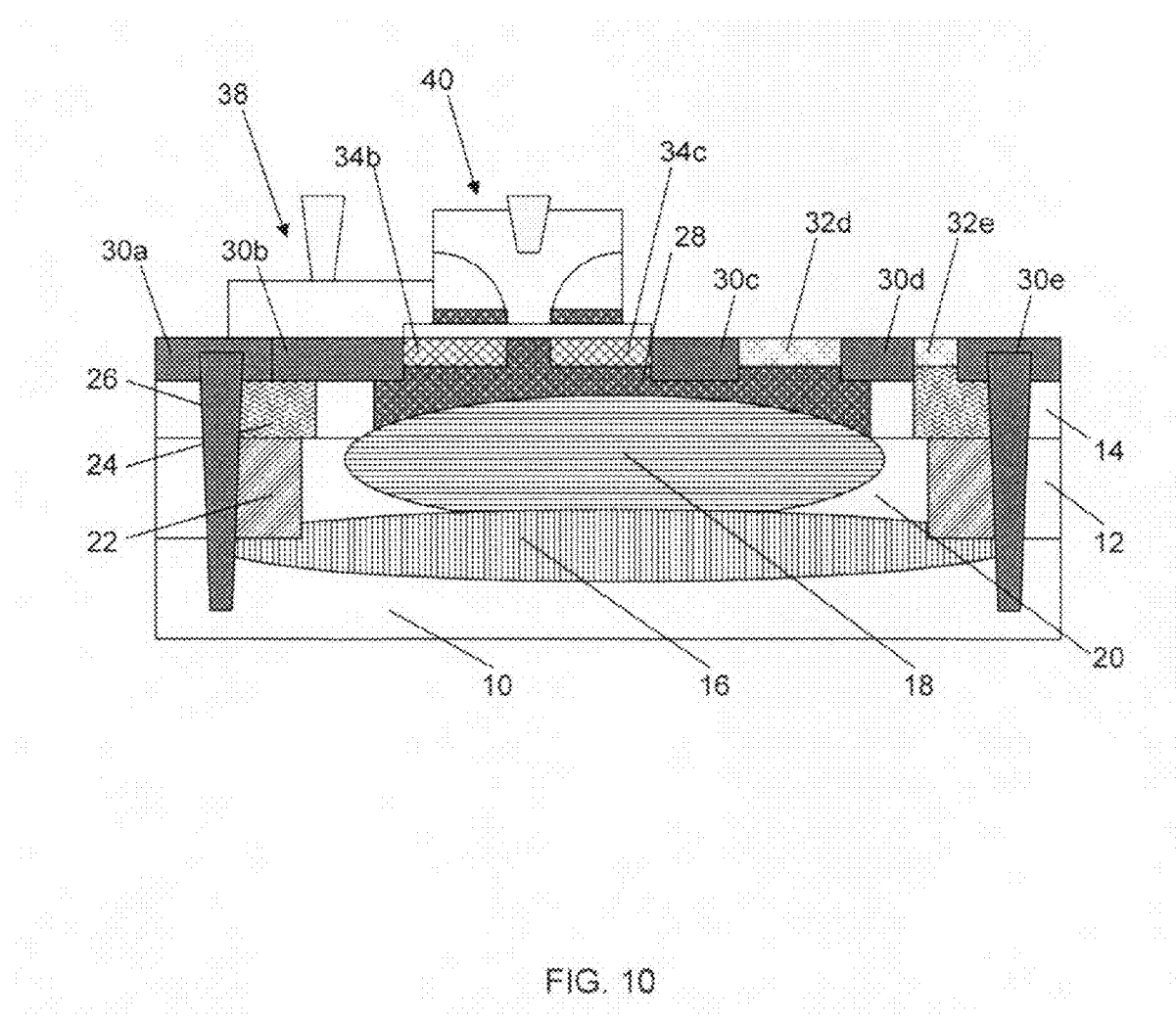

FIG. 10 shows a double-epi double sub-collector Silicon Germanium (SiGe) hetero-junction bipolar transistor (HBT). In this embodiment, the device comprises a base structure 38 on the surface of a shallow trench isolation 30$b$. The device further comprises an emitter structure 40 in contact with the N-well 28. In embodiments, as should be well known to those of skill in the art, the emitter structure includes N-type polysilicon (which forms the emitter) formed between insulators on a layer of single crystal silicon germanium. In this embodiment, the near sub-collector 18 is in contact with the deep sub-collector 16.

Figure 11:
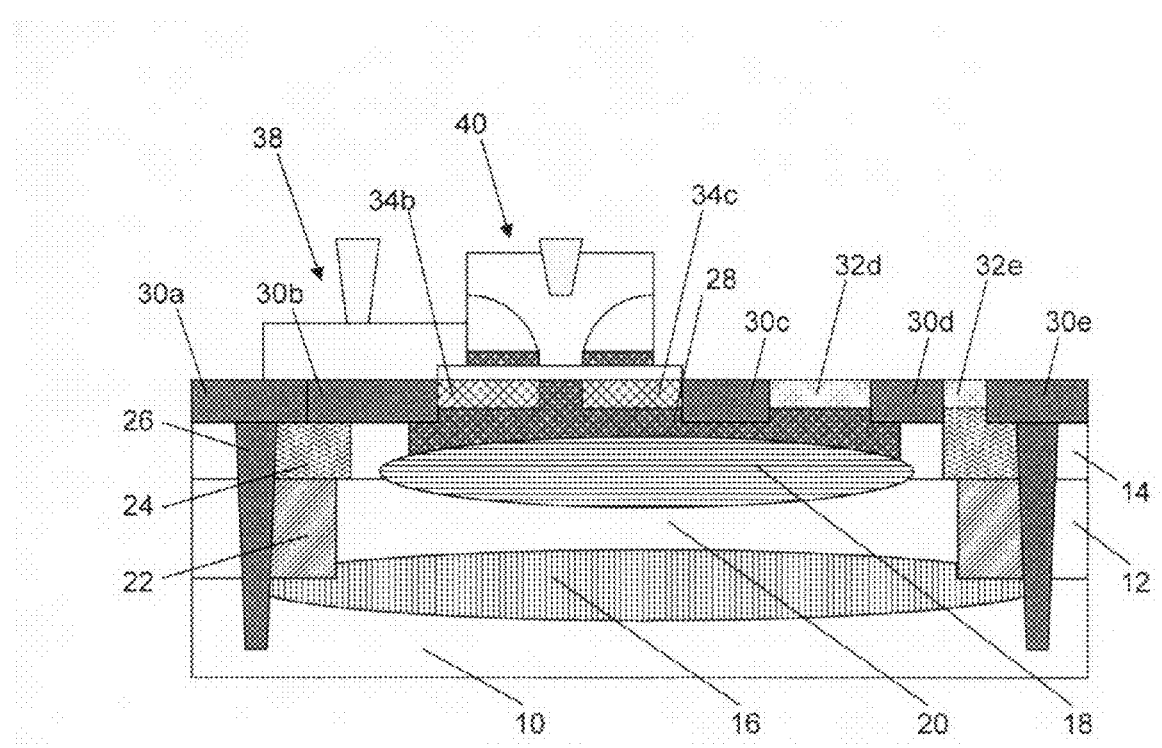

FIG. 11 shows a double-epi double sub-collector Silicon Germanium (SiGe) hetero-junction bipolar transistor (HBT) with ring isolation. In this embodiment, the device comprises a base structure 38 on the surface of a shallow trench isolation 30$b$. The device further comprises an emitter structure 40 in contact with the N-well 28. In this embodiment, the near sub-collector 18 is in contact with the doped region 20, which is, in turn, in contact with the deep sub-collector 16.

In the double-epi triple-well embodiments discussed above, the P-region in the first epi layer may be an isolated epi region, which is bounded by the deep and near reach-throughs and the deep sub-collector. In these embodiments, the deep and near reach-throughs and the deep sub-collector isolate the first epi layer and serve as a cathode, or serve as an independent electrode.

In all the embodiments discussed above, the structure and arrangement of the dual epitaxial layers and alternative elements protect against the damage cause by ESD, and yet decrease the injection from the P+ or N+ diffusion into the substrate, such that noise is reduced. Additionally, in the various embodiments, benefits can be realized, for example: reduction of the lateral bipolar gain; elimination of the lateral injection to adjacent structures; independent biasing of an isolated epi region; prevention of injection from the substrate back into the device; preclusion of Darlington string amplification effects; production of a very high-current, low-voltage turn-on circuit; or complete isolation of a P-shape or an N-shape from the substrate, all while maintaining the ability to discharge surges in voltage.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A device comprising:
   a P− doped region located within a first epitaxial layer which is isolated by at least one of either a deep trench isolation structure or a reach-through structure;
   a first sub-collector formed in an upper portion of a substrate and a lower portion of the first epitaxial layer;
   an N-well formed in a portion of a second epitaxial layer above the first epitaxial layer; and
   a first N+ diffusion region in contact with the N-well; and
   a second N+ diffusion region electrically connecting with the first sub-collector.

2. The device according to claim 1, further comprising a second sub-collector formed in an upper portion of the first epitaxial layer and a lower portion of the second epitaxial layer.

3. The device according to claim 1, further comprising shallow trench isolation structures isolating the N+ diffusion regions and forming an STI-bound diode.

4. The device according to claim 2, further comprising a P+ diffusion region between the first and second sub-collectors, wherein the second sub-collector forms the cathode of a P+/N+ diode in a P− region.

5. The device of claim 2, further comprising a reach-through structure connecting the first N+ diffusion region with the second sub-collector.

6. The device of claim 1, further comprising:
   a P+ diffusion region; and a polysilicon MOSFET gate structure between the P+ diffusion region and the first N+ diffusion region forming a polysilicon bound diode.

7. The device of claim 1, wherein the N-well and the P− doped region form an N-well diode and a vertical NPN.

8. The device of claim 1, wherein the N+ diffusion region and the P− doped region form an N+ diffusion diode and a vertical NPN.

* * * * *